United States Patent
Song et al.

(10) Patent No.: US 7,745,836 B2
(45) Date of Patent: Jun. 29, 2010

(54) HIGH-POWER, BROAD-BAND, SUPERLUMINESCENT DIODE AND METHOD OF FABRICATING THE SAME

(75) Inventors: Jung-Ho Song, Daejeon (KR); Ki-Soo Kim, Daejeon (KR); Young-Ahn Leem, Daejeon (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 186 days.

(21) Appl. No.: 12/118,543

(22) Filed: May 9, 2008

(65) Prior Publication Data

US 2009/0152528 A1 Jun. 18, 2009

(30) Foreign Application Priority Data

Sep. 18, 2007 (KR) .................. 10-2007-0094558

(51) Int. Cl.
*H01L 29/16* (2006.01)
(52) U.S. Cl. .................. 257/82; 257/98; 257/99; 257/618; 257/E33.001; 362/84; 438/22; 438/29; 438/69
(58) Field of Classification Search ............ 257/79, 257/82, 98, 99, 618, E33.001; 362/84; 438/22, 438/29, 69
See application file for complete search history.

(56) References Cited

U.S. PATENT DOCUMENTS 5,889,294 A * 3/1999 Kashima et al. ............. 257/80

6,184,542 B1 2/2001 Alphonse
2007/0223549 A1* 9/2007 Livshits et al. ............ 372/45.01

FOREIGN PATENT DOCUMENTS

| JP | 5182758 A | 7/1993 |
| JP | 08-032169 | 2/1996 |
| JP | 09-232625 | 9/1997 |
| KR | 1020020089386 A | 11/2002 |

OTHER PUBLICATIONS

Teik-Kooi Ong et al., "High performance quantum well intermixed superluminescent diodes", Meas. Sco. Technol. vol. 15(2004), pp. 1591-1595.
Yasumasa Kashima et al., Broad Spectrum InGaAsP Edge-Emitting Light-Emitting Diode Using Selective-Area Metal-Organic Vapor-Phase Epitaxy), IEEE Photonic Technology Letters, vol. 10, No. 9, Sep. 1998, pp. 1223-1225.
Jung Ho Song et al., "High-Power Broad-Band Superluminescent Diode Using Selective Area Growth at 1.5-μm Wavelength", Pacific Ring 2007 Korea, Aug. 26-31, 2007, pp. 604-605.

* cited by examiner

*Primary Examiner*—Evan Pert
*Assistant Examiner*—Scott R Wilson

(57) ABSTRACT

Provided are a superluminescent diode with a high optical power and a broad wavelength band, and a method of fabricating the same. The superluminescent diode includes: at least one high optical confinement factor (HOCF) region; and at least one low optical confinement factor (LOCF) region having a lower optical confinement factor than the HOCF region. The method includes obtaining a difference of optical confinement factors in the HOCF region and the LOCF region through a selective area growth method, the selective area growth method using a deposition thicknesses difference of thin layers according to a width difference of openings that expose a substrate.

17 Claims, 6 Drawing Sheets

HIGH-POWER, BROAD-BAND, SUPERLUMINESCENT DIODE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2007-0094558, filed on Sep. 18, 2007, the entire contents of which are hereby incorporated by reference.

BACKGROUND OF THE INVENTION

The present invention disclosed herein relates to an optoelectronic device and a method of fabricating the same, and more particularly, to a superluminescent diode with a high optical power and a broad wavelength band, and a method of fabricating the same.

The present invention has been derived from research undertaken as a part of the information technology (IT) development business by Ministry of Information and Communication and Institute for Information Technology Advancement in the Republic of Korea (Project management No.: 2006-S-004-02, Project title: silicon based high speed optical interconnection IC).

A superluminescent diode (SLD) is an optical device capable of providing several advantages such as a high optical power, a wide optical bandwidth, and a low spectral modulation. Therefore, the SLD is used as a light source for an optical gyroscope, a test of a wavelength-division multiplexing (WDM) system, an optical coherence tomography (OCT), and a fiber-optic sensor.

Like a laser diode, the SLD uses optical amplification phenomena by stimulated emission to achieve high optical power. In order to achieve a wide optical bandwidth, however, the SLD should be configured to reduce optical resonance phenomena, which differs from the laser diode. Accordingly, the SLD has much higher optical power (that is, close to an optical power of a laser diode) than a light emitting diode (LED), and also has much broader optical bandwidth than a laser diode.

A typical structure of the SLD is similar to that of a laser diode, but its reflective surfaces constituting a resonator have a relatively low reflectivity so as to reduce optical resonance phenomena. To reduce the reflectivity of the reflective surface in the SLD, there are provided various methods, for example, an antireflection coating technique, a method of providing an absorption region, or a method of forming an oblique reflective surface.

In addition, other typical methods for increasing a wavelength bandwidth have been proposed. As one of the typical methods, U.S. Pat. No. 6,184,542 (Alphonse et al., "superluminescent diode and optical amplifier with extended bandwidth") discloses a method of attaching active layers with different wavelengths along a direction of an optical waveguide. As another typical method, a method of using quantum well intermixing technique has been proposed in a paper by Ong et al. ("High performance quantum well intermixed superluminescent diode", Measurement Science and Technology, vol. 15 (2004), pp. 1591-1595). However, these methods may increase a wavelength bandwidth of the SLD, but have a limitation in that it is difficult to provide a required high optical power. For example, the optical power of the SLD according to the paper of Ong et al. is excessively low, e.g., about 1.5 mW.

SUMMARY OF THE INVENTION

The present invention provides a superluminescent diode with high optical power and wide optical bandwidth.

The present invention also provides a method of fabricating a superluminescent diode with high optical power and wide optical bandwidth.

Embodiments of the present invention provide superluminescent diodes including: at least one high optical confinement factor (HOCF) region; and at least one low optical confinement factor (LOCF) region having a lower optical confinement factor than the HOCF region.

In some embodiments, each of the HOCF and LOCF regions includes a quantum well structure including a plurality of barrier layers and at least one quantum well layer interposed between the barrier layers.

In other embodiments, a wavelength of light emitted from the HOCF region is the same as that of the LOCF region.

In still other embodiments, the quantum well layers and the barrier layers of the HOCF and LOCF regions have at least one same factor of thickness and composition.

In even other embodiments, the HOCF and LOCF regions differ in number of the quantum well layers of the quantum well structure.

In yet other embodiments, a wavelength of light emitted from the HOCF region is different from a wavelength of light emitted from the LOCF region.

In further embodiments, the HOCF and LOCF regions differ in thickness of at least one of the quantum well layer and the barrier layers.

In still further embodiments, the HOCF and LOCF regions differ in composition of at least one of the quantum well layer and the barrier layers.

In even further embodiments, each of the HOCF and LOCF regions further includes confinement layers that sandwich the quantum well structures, and the HOCF and LOCF regions differ in at least one factor of thickness and composition of the confinement layers.

In even further embodiment, the HOCF and LOCF regions are configured to form a continuously connected waveguide.

In even further embodiment, a power and a wavelength bandwidth of light outputted from the superluminescent diode are determined by lengths of the HOCF and LOCF regions.

In even further embodiment, the above superluminescent diode further includes a transition region disposed between the HOCF and LOCF regions to reduce an optical reflection therebetween, wherein a thickness of the transition region gradually decreases as it approaches from the HOCF region toward the LOCF region.

In even further embodiment, an optical confinement factor of the transition region gradually decreases as it approaches from the HOCF region toward the LOCF region.

In other embodiments of the present invention, methods of fabricating the above superluminescent diode include: obtaining a difference of optical confinement factors in the HOCF region and the LOCF region through a selective area growth method, the selective area growth method using a deposition thicknesses difference of thin layers according to a width difference of openings that expose a substrate.

In some embodiments, the selective area growth includes: the forming of the at least one HOCF region and the LOCF region includes: forming a mask pattern on the substrate, the mask pattern having a narrow opening and a broad opening; and respectively forming a first active layer and a second active layer in the narrow opening and the broad opening through a metal organic chemical vapor deposition (MOCVD) method, wherein the first active layer includes a higher optical confinement factor than the second active layer.

In other embodiments, the mask pattern further includes an intermediate opening with a width gradually increasing connects the narrow opening with the broad opening, wherein an intermediate active layer is formed in the intermediate opening, the intermediate active layer having a gradually increasing width and connecting the first active layer with the second active layer.

According to the present invention, provided is a superluminescent diode in which an active layer having a high optical confinement factor and an active layer having a low optical confinement factor are continuously connected. The active layer having a high optical confinement factor generates a high-output light, and the active layer having a low optical confinement factor reduces saturation of an optical gain in order to amplify light in a broad wavelength band. Accordingly, the light which is generated in the active layer having the high optical confinement factor, can be amplified in the active layer having a low optical confinement factor without saturation. Consequently, the superluminescent diode can provide a high optical power and a broad wavelength bandwidth.

Additionally, according to the present invention, an output and a wavelength bandwidth of emitted light can be changed by adjusting the length of the active layer having a high optical confinement factor and the length of the active layer having a low optical confinement factor. Accordingly, the superluminescent diode of the present invention may easily realize characteristics that a user requires.

According to one embodiment, the width of a quantum well is smaller in the active layer having a low optical confinement factor than the active layer having a high optical confinement factor. In this case, besides the characteristics related to the optical confinement factor, a phenomenon where the light generated in the active layer of a low optical confinement factor saturates the active layer of a high optical confinement factor can be prevented.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
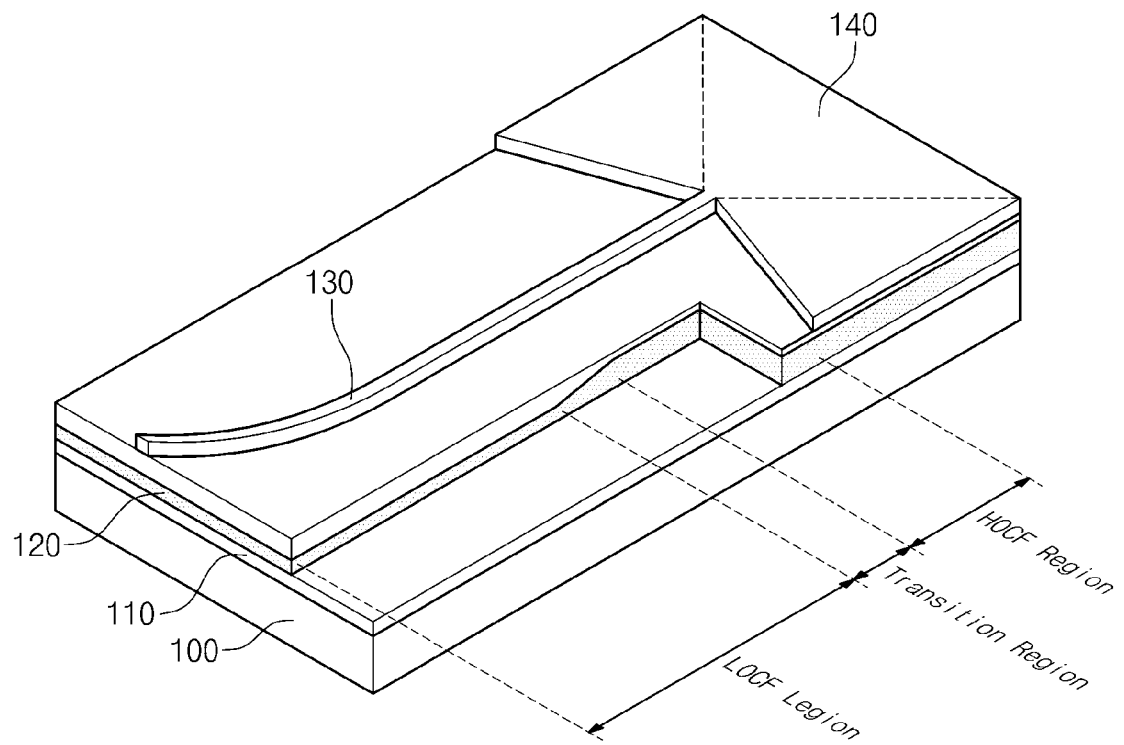
FIG. 1 is a perspective view of a superluminescent diode according to one embodiment of the present invention.

FIG. 1 is a perspective view of a superluminescent diode according to one embodiment of the present invention.

Referring to FIG. 1, the superluminescent diode according to one embodiment of the present invention includes a clad layer disposed on a substrate 100 and an active layer 120 inserted in the clad layer. The clad layer includes an n-type semiconductor layer 110 and a p-type semiconductor layer 130. The active layer 120 is interposed between the n-type and p-type semiconductor layers 110 and 130.

The active layer 120 includes a lower separate confinement heterostructure layer (see 122 of FIG. 7), an upper separate confinement heterostructure layer (see 126 of FIG. 7), and a quantum well structure interposed therebetween. The quantum well structure includes a plurality of barrier layers (see 301, 302, 303, 304, and 305 of FIG. 7) and at least one quantum well layer (see 311, 312, 313, or 314 of FIG. 7) between the barrier layers 301, 302, 303, 304, and 305. According to one embodiment of the present invention, the number of quantum well layers 311 to 314 is between 1 and 10, and each of them may be 0.5% compressively strained 4 nm InGaAsP ($\lambda_g$=1.7 μm). Additionally, the barrier layers 301 to 305 may be lattice matched InGaAsP ($\lambda_g$=1.3 μm). However, the thicknesses and compositions of the quantum well layers 311 to 314 and the barriers 301 to 305 are not limited to the above case. For example, as will be described later, the active layer 120 includes a high optical confinement factor (HOCF) region and a low optical confinement factor (LOCF) region having respectively different confinement factors, and the HOCF region and the LOCF region may have differences in thicknesses and compositions of the quantum well layers 311 to 314, the lower and upper confinement layers 122 and 126, and the barrier layers 301 to 305.

When a voltage is applied to the active layer 120, electrons of the active layer 120 have an excited state to participate in luminescence phenomenon. Due to spontaneous emission and stimulated emission, the excited electrons are transited to a low energy level and recombines with holes, thereby emitting light. The wavelength of light generated through the above processes can be adjusted by controlling the thickness of the quantum well layers 311 to 314 and compositions of the quantum well layers 311 to 314 and the barrier layers 301 to 305.

The lower and upper confinement layers 122 and 126 confines the light, generated through the above processes, in a direction perpendicular to the substrate 100. For this end, the lower and upper confinements 122 and 126 may be formed of a material having different refractive index than those of the quantum well layers 311 to 314. Additionally, to supply a current to the active layer 120, a conductive material (e.g., a metal layer) can be deposited on the n-type and p-type semiconductor layers 110 and 130.

The p-type semiconductor layer 130 is patterned to define a waveguide. For example, when the p-type semiconductor layer 130 is patterned in a stripe form, the waveguide may be formed in a direction parallel to the substrate 100. In this case, the light generated in the active layer 120 has a predetermined spatial distribution (i.e., a mode), propagates along the waveguide, and then is amplified by a current applied to the active layer 120. According to the present invention, to reduce an optical resonance phenomenon, the p-type semiconductor layer 130 has a portion bent at about 8° with respect to a major axis of the superluminescent diode chip as illustrated in FIG. 1. Furthermore, to reduce an optical resonance phenomenon, an antireflection coating layer may be formed at an end of the optical waveguide or an absorption region 140 may be provided at one side of the optical waveguide.

According to the present invention, the active layer 120 includes at least one HOCF region having a high optical confinement factor and at least one LOCF region having a low optical confinement factor. The optical confinement factor represents how much a spatial distribution of light corresponds to the active layer 120 (more specifically, the quantum well layers 311 to 314 in the quantum well structure), and can be adjusted by controlling the compositions of the quantum well layers 311 to 314 and the compositions of the lower and upper confinement layers 122 and 126 like wavelengths of light. More detailed description related to the optical confinement factor will be descried with reference to Equation 1 below.

The HOCF region is configured to provide a high optical power, and the LOCF region is configured to allow an optical amplification in a broad wavelength bandwidth by suppressing saturation of an optical gain. At this point, the waveguides of the HOCF region and the LOCF region are continuously connected. Accordingly, the light of a high-output broadband generated in the HOCF region can be amplified in the LOCF region, while maintaining the broad wavelength bandwidth without saturation.

According to one embodiment of the present invention, an output and a wavelength bandwidth of the emitted light can be controlled by adjusting the lengths of the HOCF region and the LOCF region. That is, the lengths of the HOCF region and the LOCF region and a ratio between them are selectively controlled if necessary in order to emit light with a required output and wavelength bandwidth.

According to one embodiment of the present invention, the LOCF region and the HOCF region of the active layer 120 can be designed to make the wavelength of the light, emitted from the LOCF region, shorter than that of the HOCF region. In this case, the phenomenon that the light emitted from the LOCF region propagates into the HOCF region to saturate the HOCF region can be prevented.

According to one embodiment of the present invention, the quantum well layers 311 to 314 may be designed to allow the LOCF region to be narrower than the HOCF region. In this case, because the wavelength of the light emitted from the LOCF region becomes shorter than that from the HOCF region, technical requirements for preventing the above saturation can be satisfied. Furthermore, in this case, since the LOCF region has a lower optical confinement factor than that of the HOCF region, technical requirements related to the optical confinement factor can be fulfilled.

On the other hand, a transition region is formed between the LOCF region and the HOCF region, and its thickness gradually increases as it approaches from the LOCF region to the HOCF region. The transition region has an optical confinement factor, which also gradually increases from the LOCF region to the HOCF region.

Below, to make the technical scope of the present invention more clearly, operations of superluminescent diode according to a difference of optical confinement factors will be concisely described.

Unlike the spontaneous emission, the stimulated emission playing an important factor in amplifying the intensity of the emitted light requires an additional photon capable of inducing electron-hole recombination. The optical gain represents the degree of amplification through processes.

Figure 2:
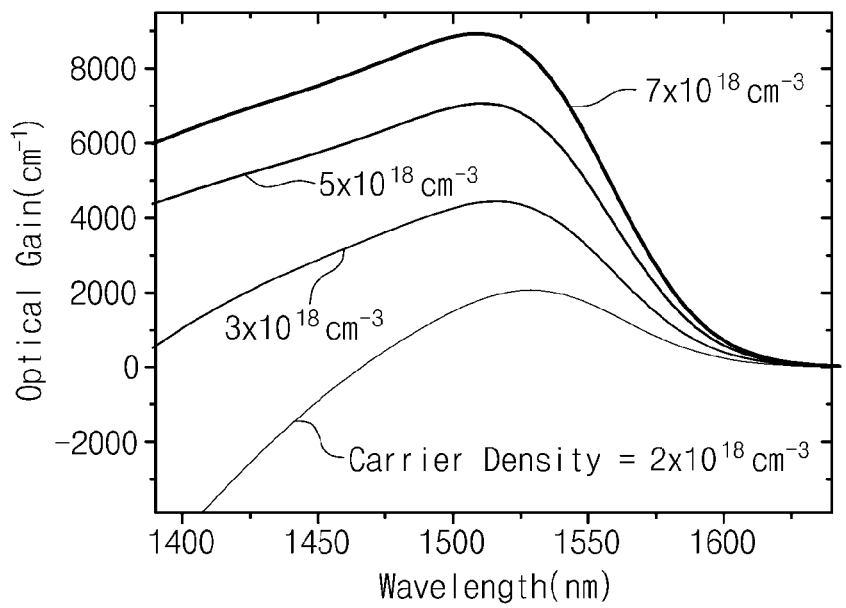
FIG. 2 is a graph illustrating an optical gain according to carrier concentration.

FIG. 2 is a graph illustrating an optical gain according to carrier concentration.

Referring to FIG. 2, as concentration of carrier increases, the wavelength bandwidth of an optical gain increases. In a case of the superluminescent diode, light generated by the spontaneous emission has a high-output with its increased intensity because of the optical gain of the simulated emission, and also this process can be quantitatively expressed in Equation 1 below.

$$\frac{dS_\lambda}{dZ} = P_\lambda(n) + \Gamma g_\lambda(n) S_\lambda \qquad \text{(Equation 1)}$$

where $S_\lambda$ represents light intensity of a wavelength $\lambda$, n represents carrier concentration, $P_\lambda$ represents a magnitude caused by spontaneous emission, $g_\lambda$ represents an optical gain, and $\Gamma$ represents an optical confinement factor.

As expressed in Equation 1, the increase in the light intensity $S_\lambda$ of the wavelength $\lambda$ in an active layer of the carrier concentration n for the small distance dZ along the propagation direction, is represented with the sum of the magnitude $P_\lambda$ by spontaneous emission and the amplified magnitude $\Gamma g_\lambda(n) S_{\lambda,by}$ the optical gain $g_\lambda$. Accordingly, power of a superluminescent diode can be increased through a method of increasing optical gain effect. Larger amplification by the optical gain can be accomplished through a method of increasing an optical confinement factor. However, the increase of the optical confinement factor can cause an output of a superluminescent diode to increase, but can reduce its wavelength bandwidth. This will be described with reference to FIGS. 3 and 4.

Figure 3:
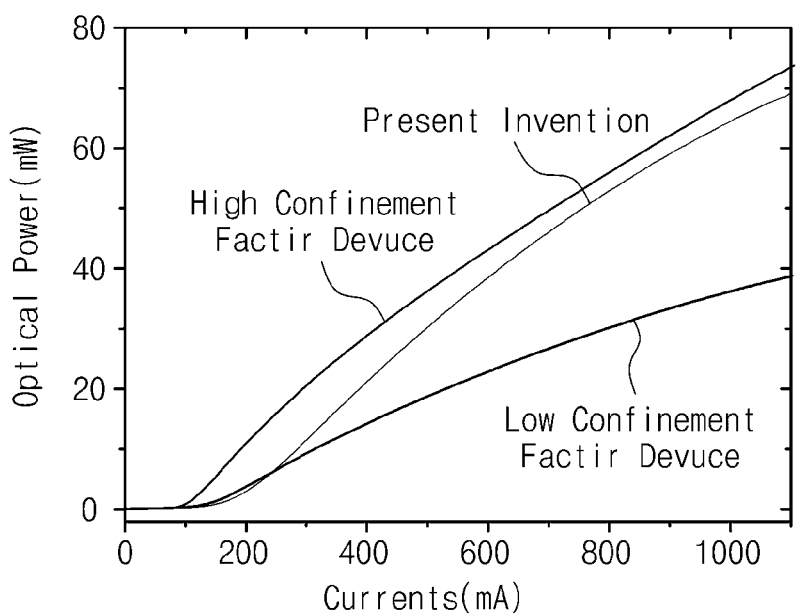
FIG. 3 is a graph illustrating a change of an optical power according to a difference of an optical confinement factor.
Figure 4:
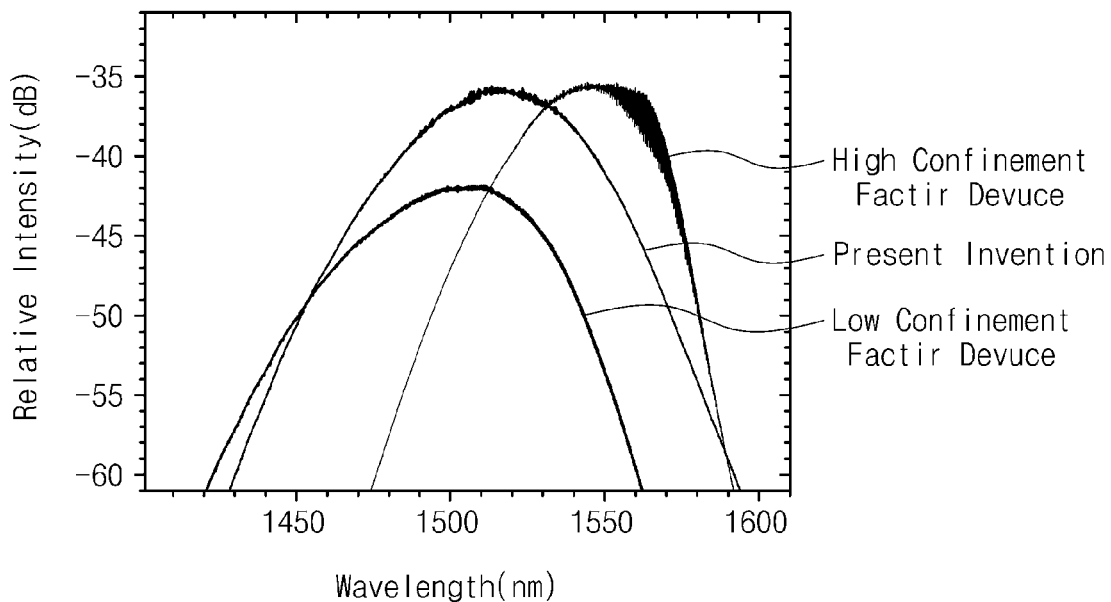
FIG. 4 is a graph illustrating a change of an optical spectrum according to a difference of an optical confinement factor.

FIG. 3 is a graph illustrating a change of an optical power according to a difference of an optical confinement factor. FIG. 4 is a graph illustrating a change of an optical spectrum according to a difference of an optical confinement factor. Specifically, FIGS. 3 and 4 are experimental results for superluminescent diodes with respectively different optical confinement factors.

Referring to FIGS. 3 and 4, as an optical confinement factor increases, an optical power increases, but a wavelength bandwidth decreases in an optical spectrum. Such a decrease in the wavelength bandwidth is resulted from excessive stimulated emission caused due to an increase in light intensity. That is, when light intensity increases, excessive stimulated emission occurs to reduce carrier concentration in an active layer. As a result, the wavelength bandwidth of an optical gain can become narrowed. This phenomenon is called the saturation of an optical gain, and this becomes worse as the optical confinement factor becomes higher.

Figure 5:
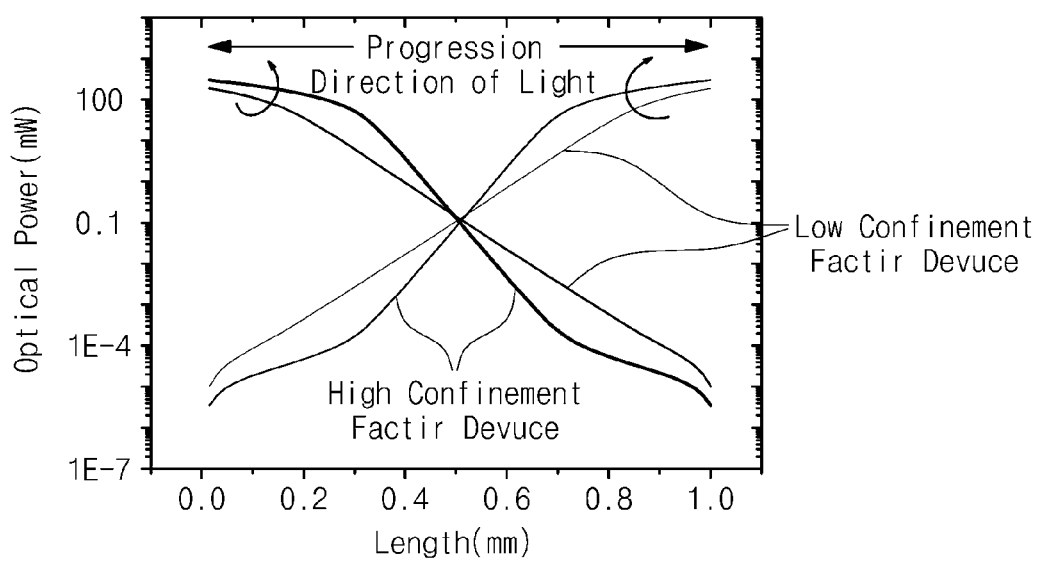
FIG. 5 is a graph illustrating a non-uniform distribution of an optical power according to a propagation path of light.
Figure 6:
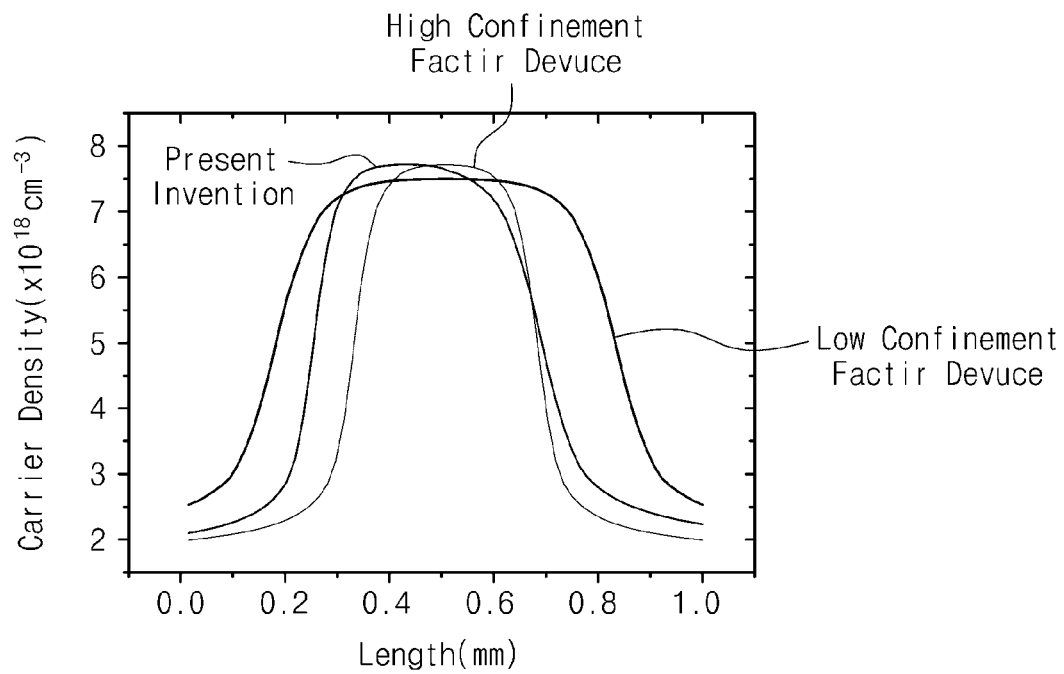
FIG. 6 is a graph illustrating a carrier concentration distribution according to a propagation path of light.

FIGS. 5 and 6 are drawings illustrating saturation of this optical gain. Specifically, FIG. 5 is a graph illustrating an unevenness of an optical power according to a propagation path of light. FIG. 6 is a graph illustrating a carrier concentration distribution according to a propagation path of light.

Unlike a laser diode, the superluminescent diode is configured to reduce reflection at the facet of the waveguide such that a broad wavelength bandwidth can be realized. Accordingly, as illustrated in FIG. 5, distribution of light intensity in a superluminescent diode is uneven according to its position on the waveguide (i.e., a propagation path of light). As a result, distribution of charge concentration is uneven according to its position on the waveguide.

In more detail, as illustrated in FIG. 6, charge concentration is low at both ends of the waveguide compared to its center, and a wavelength bandwidth of an emitted light is reduced due to the decrease in carrier concentration. That is, referring to FIG. 6, the charge concentration at both ends of the waveguide is about $2\times10^{18}$ cm$^{-3}$ when an optical confinement factor is large, and is about $2.5\times10^{18}$ cm$^{-3}$ when an optical confinement factor is small. Referring to FIG. 2 illustrating an optical gain according to concentration of charge, the reduction of charge concentration at the both ends of the waveguide amplifies only the light in a narrow wavelength band. Accordingly, in a case of a high optical confinement factor, the wavelength bandwidth of an emitted light is reduced.

Due to optical confinement factor influences for output and wavelength bandwidth characteristics of a superluminescent diode, a related art superluminescent diode has limitations in simultaneously realizing high-output and broad wavelength bandwidth characteristics. However, the superluminescent diode of the present invention with the HOCF region and the LOCF region can overcome those technical limitations. Below, the HOCF region and the LOCF region of the superluminescent diode will be described in more detail.

Figure 7:
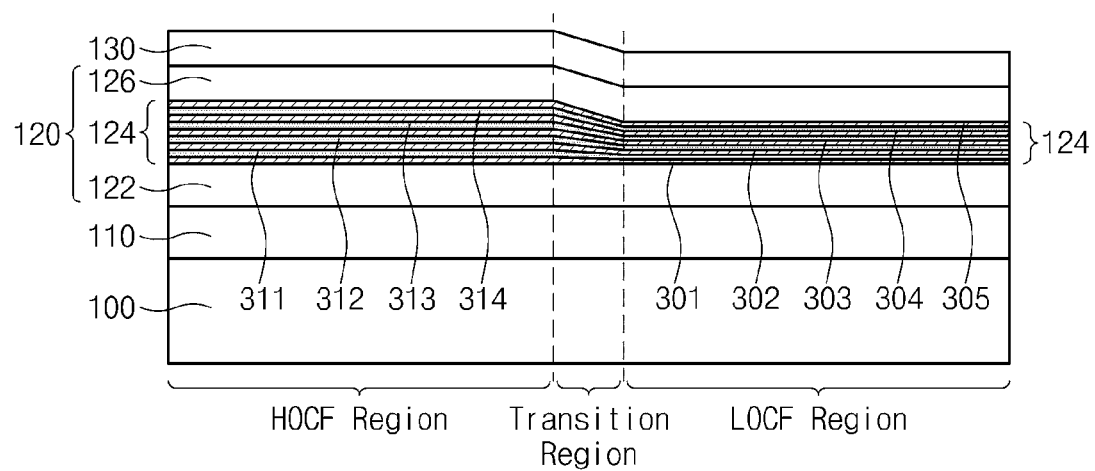
FIG. 7 is a sectional view of a superluminescent diode according to the present invention.

FIG. 7 is a sectional view of a superluminescent diode according to the present invention. To efficiently explain the technical idea of the present invention, as illustrated in FIG. 7, the superluminescent diode with one HOCF region and one LOCF region is schematically illustrated. However, the number of the HOCF and LOCF regions and their geometric characteristics such as positions and dimensions can vary if necessary.

Referring to FIG. 7, the active layer 120 includes the HOCF region and the LOCF region. The HOCF region is configured to output a high-power light, and the LOCF region is configured to have an increased saturation output power. According to one embodiment of the present invention, the HOCF region may be a high-power light emitting diode (LED) or its modification, and the LOCF region may be a high-output semiconductor optical amplifier (SOA) or its modification. That is, the superluminescent diode of the present invention may be an integrated device of the high-power LED and the high-power broadband SOA. According to this embodiment, light of a high-power broadband generated in the HOCF region propagates into and amplified by the LOCF region. At this point, the LOCF region has a high saturation output and a broad amplification bandwidth. The light transmitted from the HOCF region maintains its broad wavelength bandwidth and is amplified without saturation during amplifications.

These effects according to the present invention can be confirmed in FIGS. 3 and 4. At this point, referring to FIGS. 3, 4, and 6, curves indicated as 'the present invention' are the results from the superluminescent diode designed to include the HOCF region and the LOCF region having respectively different confinement factors. Various technical requirements related to an output power and a wavelength bandwidth can be satisfied through a method of changing the lengths of the HOCF region and the LOCF region.

Referring to FIG. 3 again, an optical power of a superluminescent diode with the HOCF region and the LOCF region according to the present invention is similar to that of the superluminescent diode with a high optical confinement factor. Additionally, referring to FIG. 4 again, a wavelength bandwidth of the superluminescent diode with the HOCF region and the LOCF region is drastically increased compared to that of the superluminescent diode with a high optical confinement factor. In this point, the superluminescent diode of the present invention can further increase a wavelength bandwidth without an excessive output decrease, compared to the superluminescent diode with a high optical confinement factor.

Furthermore, referring to FIG. 6 again, carrier concentration distribution of the superluminescent diode has higher carrier concentration at the both ends of the waveguide, compared to a high optical confinement factor. At this point, when considering that a wavelength bandwidth of optical gain in a region having a low carrier concentration is decreased, a wavelength bandwidth of optical gain in a region where saturation phenomenon occurs is wider in the superluminescent diode with the HOCF region and the LOCF region, compared to a high optical confinement factor.

Figure 8:
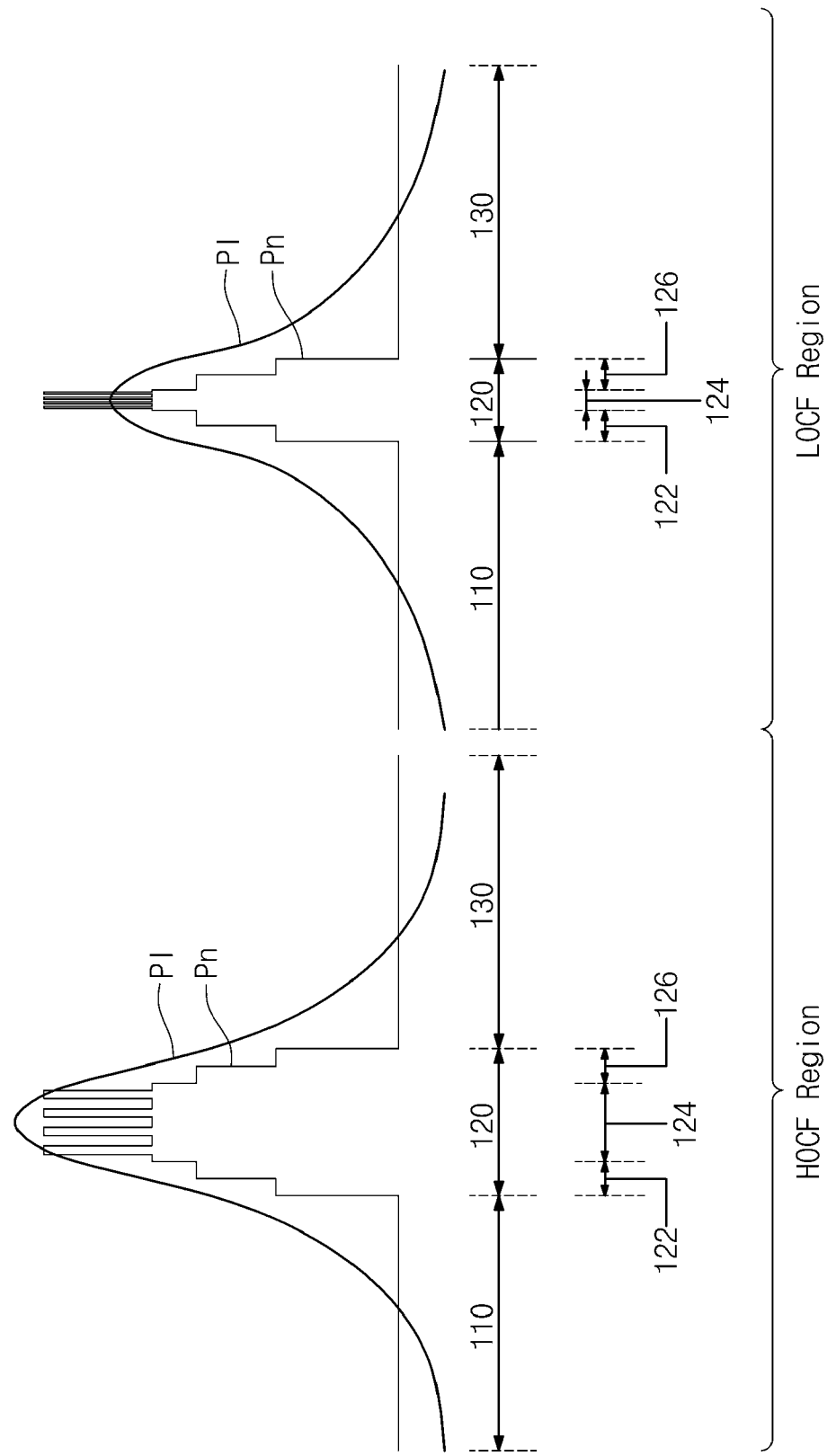
FIG. 8 is a graph illustrating relationship between a refractive index profile of a superluminescent diode and a spatial distribution profile of light according to the present invention.

FIG. 8 is a graph illustrating relationship between a reflective index profile Pn and a spatial distribution (i.e., a mode) profile PI of light at each active layer. At this point, the reflective index profile Pn is a reflectivity of each active layer according to a direction perpendicular to the substrate 100.

Referring to FIG. 8, the thickness of the quantum well layers 311 to 314 at the HOCF region is greater than that of the LOCF region. In this case, the mode intensity of the quantum well is higher in the HOCF region than the LOCF region. In this point, as it is intended, the HOCF region has a higher optical confinement factor than the LOCF region.

However, this difference of an optical confinement factor between the HOCF region and the LOCF region can be realized through various methods. That is, in the quantum well structure according to the embodiment of FIG. 8, a difference between the required optical confinement factors is realized through a method of changing the thickness of the quantum well layers 311 to 314, and also can be realized through a method of changing the thickness of the lower and upper confinement layers 122 and 126 without changing the thickness of the quantum well layers 311 to 314. Furthermore, a difference of required optical confinement factors can be realized through a method of changing the compositions of the quantum well layers 311 to 314, the barrier layers 301 to 315 disposing the quantum well layers 311 to 314 therebetween, and the lower and upper confinement layers 122 and 126.

According to the modified embodiment, this difference of the required optical confinement factors can be achieved through a method of forming the active layer 120 to allow the HOCF and LOCF regions to include respectively different quantum well layers.

According to one embodiment of the present invention, the LOCF region is configured to emit light of a wavelength length shorter than that from the HOCF region. For example, as described above, when the width of the quantum well at the LOCF region is shorter than that of the HOCF region, technical requirements related to the emission wavelength and the optical confinement factors can be satisfied.

When a wavelength of the light emitted from the LOCF region is shorter than that of the HOCF region, output and wavelength bandwidth reduction due to an unintentional stimulated emission can be prevented at the HOCF region. In more detail, if these requirements are not satisfied, the light generated in the LOCF region propagates into the HOCF region, and may cause stimulated emission at the HOCF region. In this case, because carrier concentration decreases at the HOCF region, the output power and wavelength bandwidth, emitted from the HOCF region, can be reduced. However, as described above, if the wavelength of the emitted light is shorter in the LOCF region than the HOCF region, the light generated in the LOCF region is not involved in stimulated emission, and adsorbed by the HOCF region. Therefore, an unintentional stimulated emission at the HOCF region and limitations according thereto can be prevented.

Figure 9:
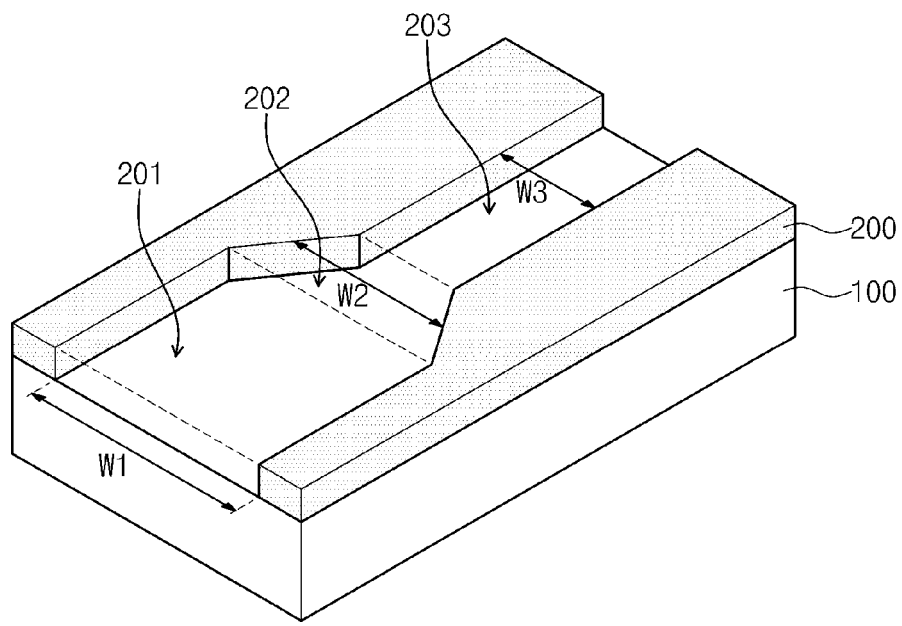
FIG. 9 is a perspective view illustrating a method of fabricating a superluminescent diode according to one embodiment of the present invention.
Figure 10:
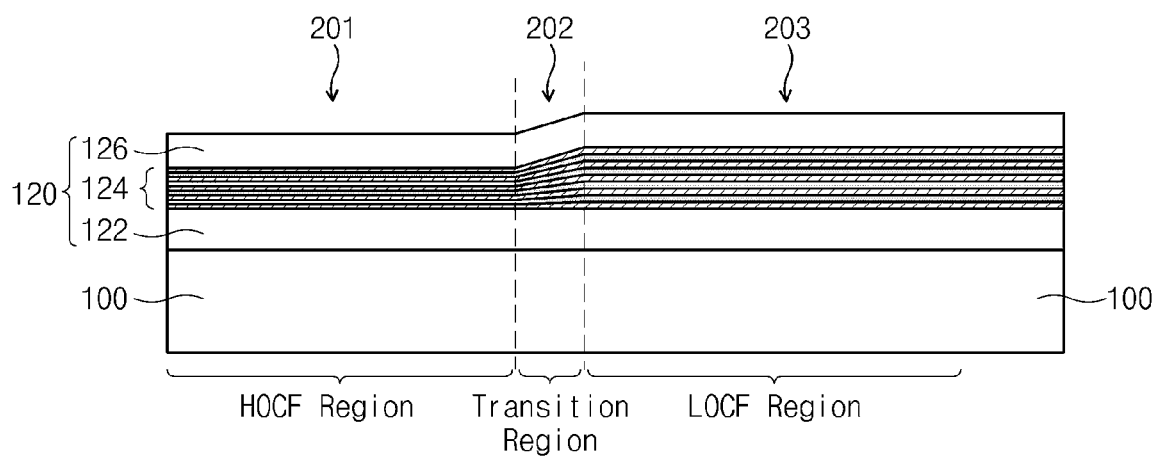
FIG. 10 is a sectional view illustrating a method of fabricating a superluminescent diode according to one embodiment of the present invention.

FIG. 9 is a perspective view illustrating a method of fabricating a superluminescent diode according to one embodiment of the present invention. FIG. 10 is a sectional view illustrating a method of fabricating a superluminescent diode according to one embodiment of the present invention.

Referring to FIG. 9, a mask pattern 200 having an opening is formed on a substrate 100, and the opening exposes the top surface of the substrate 100. The opening defines the shape of the active layer 120. For example, the opening includes a first opening 201, a second opening 202, and a third opening 203, which respectively define shapes of a LOCF region, a transition region, and a HOCF region. According to the present invention, the first opening 201 has the broader width than the third opening 203 (W1>W3), and the second opening 202 has the width that is gradually reduced as it approaches from the first opening 201 toward the third opening 203 (W1>W2>W3).

The mask pattern 200 may be formed of one of materials that do not grow a thin layer at the top of the substrate during a metal organic chemical vapor deposition (MOCVD) process. For example, the mask pattern 200 may be formed of a silicon oxide layer, but the present invention is not limited to this material.

Referring to FIG. 10, through an MOCVD process, thin layers are formed to constitute the active layer 120. The thin layers may be one of III-V group compounds. While the mask pattern 200 is used, atoms or molecules constituting the thin layer are not formed on the mask pattern 200, and are involved in thin layer growth after migrating toward the exposed substrate 100 through the opening. At this point, the thickness and composition of the thin layer may vary according to the width of the opening. In more detail, as the width of the opening decreases, the number of atoms or molecules migrating from the mask pattern 200 toward the top surface of the substrate 100 increases. Therefore, the growth thickness of the thin layer increases.

Accordingly, as described above, when the mask pattern 200 includes the openings 201 to 203 having respectively different widths, it is possible to form active layers having respectively different physical structures (that is, thickness) on one substrate 100. In more detail, according to the present invention, the thickness of the active layer 120 is thicker in the third opening 203 than the first opening 201, and increases in the second opening 202 as it approaches from the first opening 201 toward the third opening 203. That is, according to this method, without an additional process, active layers of the LOCF region, the transition region, and the HOCF region can have respectively different thicknesses.

The above method is called a selective area growth method. Because of the selective area growth method, the thicknesses of the quantum well layers 311 and 314, the barriers 301 to 305, and the confinement layers 122 and 126 increase further at the HOCF region, compared to the LOCF region. Accordingly, the HOCF region has a more increased optical confinement factor compared to the LOCF region. Furthermore, since the width of the quantum well increases more in the HOCF region than the LOCF region, the wavelength of the emitted light becomes longer in the HOCF region than the LOCF region. As a result, the light that propagates from the LOCF region toward the HOCF region is absorbed by the HOCF region, and thus an unwanted stimulated emission can be prevented at the HOCF region.

Additionally, the selective area growth method allows the thickness of the transition region to gradually increase as it approaches from the LOCF region toward the HOCF region. Therefore, the optical confinement factor of the transition region gradually increases as it approaches from the LOCF region to the HOCF region. Theses gradual changes of the transition region, which are related to the thickness and optical confinement factor, allow the superluminescent diode of the present invention to have reduced spectral modulation characteristics by reducing an optical reflectivity between the LOCF region and the HOCF region.

On the other hand, according to the modified embodiment of the present invention, the first active layer is grown on the entire surface of the substrate 100, and then after etching and removing a portion of the first active layer, a butt-joint method that selectively growing a second active layer on the removed area can be used to form active layers having respectively different structures on one substrate 100.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A superluminescent diode comprising an active layer, the active layer including:
　at least one high optical confinement factor (HOCF) region; and
　at least one low optical confinement factor (LOCF) region having a lower optical confinement factor than the HOCF region,
　wherein the active layer is configured to enable light to propagate through the low optical confinement factor (LOCF) region and the high optical confinement factor (HOCF) region.

2. The superluminescent diode of claim 1, wherein each of the HOCF and LOCF regions comprises a quantum well structure including a plurality of barrier layers and at least one quantum well layer interposed between the barrier layers.

3. The superluminescent diode of claim 2, wherein a wavelength of light emitted from the HOCF region is the same as that of the LOCF region.

4. The superluminescent diode of claim 3, wherein the quantum well layers and the barrier layers of the HOCF and LOCF regions have at least one same factor of thickness and composition.

5. The superluminescent diode of claim 2, the active layer further comprising:
　at least one confinement layers provided over a first side of the quantum well structures,
　wherein the HOCF and LOCF regions differ in at least one factor of thickness and composition of the confinement layers.

6. The superluminescent diode of claim 1, wherein a wavelength of light emitted from the HOCF region is different from a wavelength of light emitted from the LOCF region.

7. The superluminescent diode of claim 6, wherein the HOCF and LOCF regions differ in thickness of at least one of the quantum well layer and the barrier layers.

8. The superluminescent diode of claim 6, wherein the HOCF and LOCF regions differ in composition of at least one of the quantum well layer and the barrier layers.

9. The superluminescent diode of claim 1, wherein the HOCF and LOCF regions are configured to form a continuously connected waveguide.

10. The superluminescent diode of claim 1, wherein a power and a wavelength bandwidth of light outputted from the superluminescent diode are determined by lengths of the HOCF and LOCF regions.

11. The superluminescent diode of claim 1, the active layer further comprising a transition region disposed between the HOCF and LOCF regions,
wherein a thickness of the transition region gradually decreases as it approaches from the HOCF region toward the LOCF region.

12. The superluminescent diode of claim 11, wherein an optical confinement factor of the transition region gradually decreases as it approaches from the HOCF region toward the LOCF region.

13. A superluminescent diode comprising an active layer, the active layer including:
at least one high optical confinement factor (HOCF) region; and
at least one low optical confinement factor (LOCF) region having a lower optical confinement factor than the HOCF region,
wherein the HOCF and LOCF regions differ in number of the quantum well layers of the quantum well structure.

14. A method of fabricating a super-luminescent diode comprising at least one high optical confinement factor (HOCF) region and at least one low optical confinement factor (LOCF) region, the method comprising:
forming an active layer including a high optical confinement factor (HOCF) region and a low optical confinement factor (LOCF) region using a selective area growth process, the selective area growth process using a deposition thicknesses difference of thin layers according to a width difference of openings that expose a substrate,
wherein the active layer is configured to enable light to propagate through the low optical confinement factor (LOCF) region and the high optical confinement factor (HOCF) region.

15. The method of claim 14, wherein the selective area growth process comprises:
forming a mask pattern on the substrate, the mask pattern having a narrow opening and a broad opening; and
filling in the narrow opening and the broad opening through a metal organic chemical vapor deposition (MOCVD) method to form the active layer,
wherein the active layer in the narrow opening defines the LOCF region and the active layer in the broad opening defines the HOCF region.

16. The method of claim 15, wherein the mask pattern further comprises an intermediate opening with a width gradually increasing that connects the narrow opening with the broad opening.

17. The method of claim 16, wherein the active layer is formed by filling in the intermediate opening through a metal organic chemical vapor deposition (MOCVD) method.

* * * * *